(12) United States Patent
Ha

(10) Patent No.: US 7,687,388 B2
(45) Date of Patent: Mar. 30, 2010

(54) METHOD OF FABRICATING SEMICONDUCTOR HIGH-VOLTAGE DEVICE COMPRISING THE STEPS OF USING PHOTOLITHOGRAPHIC PROCESSES TO FORM NITRIDE SPACER REGIONS AND DRY ETCH PROCESS TO FORM DEEP TRENCH REGIONS

(75) Inventor: Seung-Chul Ha, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 17 days.

(21) Appl. No.: 12/145,530

(22) Filed: Jun. 25, 2008

(65) Prior Publication Data

US 2009/0008746 A1    Jan. 8, 2009

(30) Foreign Application Priority Data

Jul. 4, 2007    (KR) .................. 10-2007-0067070

(51) Int. Cl.
*H01L 21/3205* (2006.01)

(52) U.S. Cl. ................ 438/589; 257/618; 257/E29.134
(58) Field of Classification Search ................ 438/589; 257/618, E29.134
See application file for complete search history.

(56) References Cited

FOREIGN PATENT DOCUMENTS

| JP | 2002-118117 | 4/2002 |
| KR | 10-2003-0032118 | 4/2003 |

*Primary Examiner*—Bradley K Smith
*Assistant Examiner*—Mohammad T Karimy
(74) *Attorney, Agent, or Firm*—Sherr & Vaughn, PLLC

(57) ABSTRACT

A semiconductor high-voltage device including a semiconductor substrate having a deep trench formed therein, a gate oxide film formed on sidewalls of the deep trench, a polysilicon layer formed in the deep trench and on the gate oxide film, and spacers formed on sidewalls of the trench at a portion of the deep trench above the gate oxide film. Loss of a gate oxide film can be prevented during processing, thereby also preventing a change of a current path, a phenomenon such as current leakage between a top surface of polysilicon and source/drain regions.

20 Claims, 5 Drawing Sheets

METHOD OF FABRICATING SEMICONDUCTOR HIGH-VOLTAGE DEVICE COMPRISING THE STEPS OF USING PHOTOLITHOGRAPHIC PROCESSES TO FORM NITRIDE SPACER REGIONS AND DRY ETCH PROCESS TO FORM DEEP TRENCH REGIONS

The present application claims priority under 35 U.S.C. §119 and 35 U.S.C. §365 to Korean Patent Application No. 10-2007-0067070 (filed on Jul. 4, 2007), which is hereby incorporated by reference in its entirety.

BACKGROUND

High-voltage semiconductor devices may generally have a vertical structure since they require a high voltage compared with complementary metal oxide semiconductor (CMOS) devices. For example, in fabricating a CMOS, voltage of about 1.5V may be used. On the other hand, in fabricating high-voltage devices, voltage of 10 to 100V, preferably, 30V may be used. For the purpose of forming a vertical structure, after a deep trench structure is formed, doped polysilicon may then be deposited to form a vertical gate electrode. For such a vertical structure of a high-voltage device, a source region and an upper boundary surface on and/or over which polysilicon is deposited may exist on the same plane. When the device operates after an electrode is formed in the source region, it may be necessary to prevent current conduction of the source region and the polysilicon upper boundary surface.

Figure 1A:
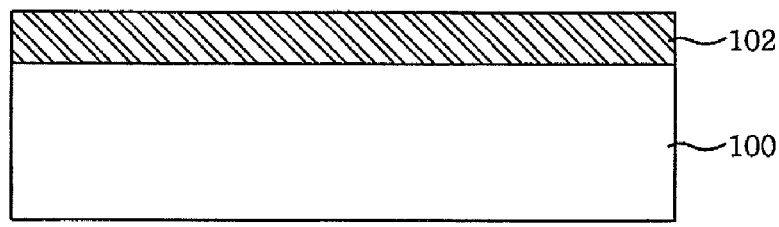

As illustrated in example FIG. 1A, a process of fabricating a semiconductor high-voltage device may include forming a thermal oxide film as hard mask 102 on and/or over the entire surface of a silicon substrate such as semiconductor substrate 100.

Figure 1B:
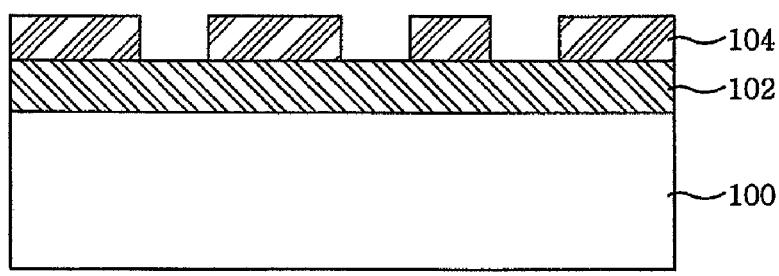

As illustrated in example FIG. 1B, a photolithography process may then be performed on hard mask 102, thus forming photoresist patterns 104 defining a gate electrode region.

Figure 1C:
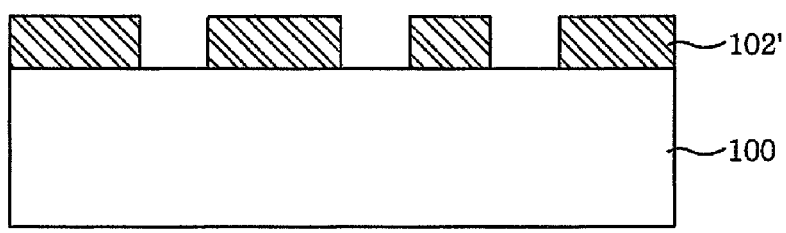
Figure 1D:
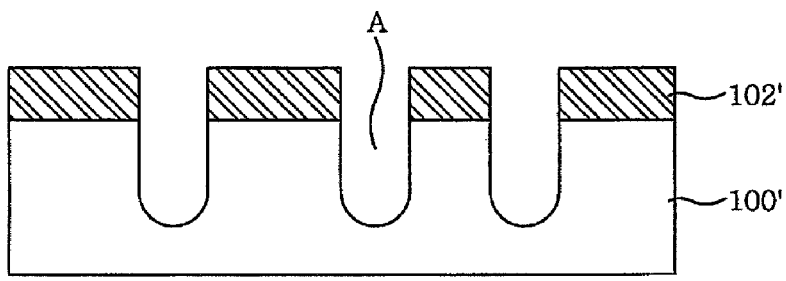

As illustrated in example FIGS. 1C and 1D, hard mask 102 may then be patterned by performing a dry etch process employing photoresist patterns 104 to from hard mask patterns 102'. The underlying semiconductor substrate 100 may then be patterned, thus forming deep trenches A. In example FIGS. 1C and 1D, reference numerals 100' and 102' denote the semiconductor substrate and the hard mask, respectively, after the patterning process.

Figure 1E:
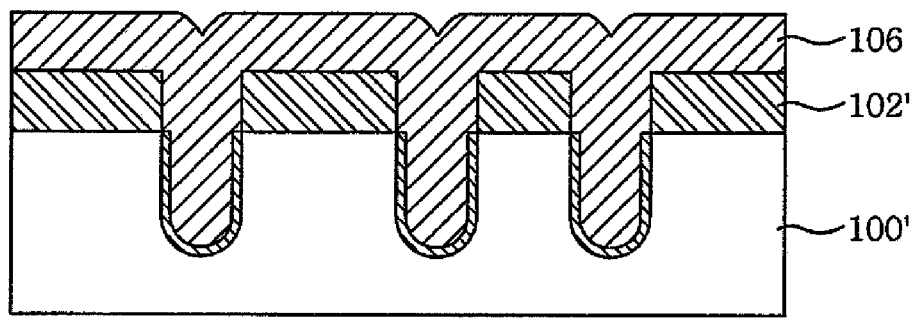

As illustrated in example FIG. 1E, gate oxide film 104 may then be formed with respect to substrate 100' and hard mask 102' on which the patterning process has been performed. Polysilicon layer 106 may then be deposited on and/or over the entire surface, thereby gap-filling trenches A having gate oxide film 104 formed therein.

Figure 1F:
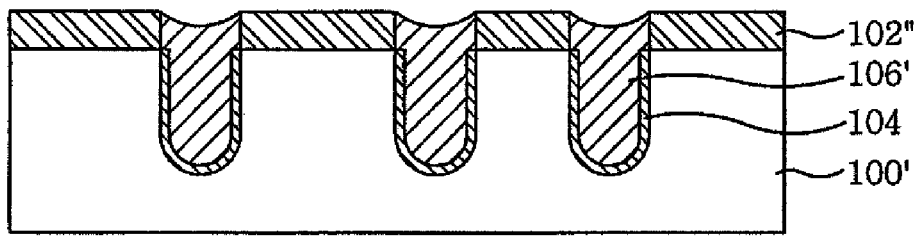

As illustrated in example FIG. 1F, a portion of polysilicon layer 106 may then be removed by performing an etchback process on polysilicon layer 106. At this time, a portion of hard mask 102' may also be removed. In example FIG. 1F, reference numerals 102'' and 106' denote the hard mask and the polysilicon, respectively, after the etchback process.

Figure 1G:
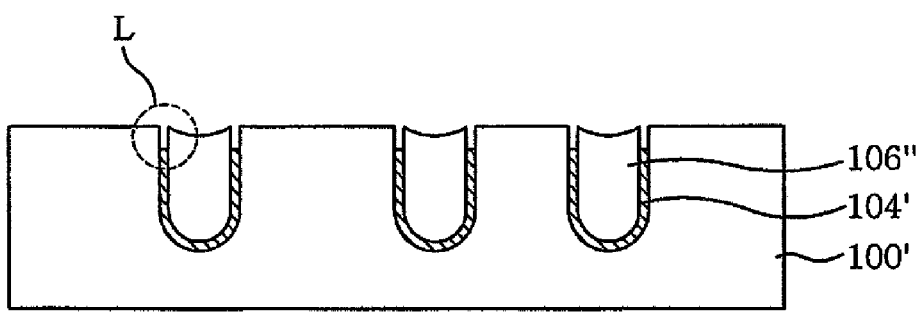

As illustrated in example FIG. 1Q all the remaining hard mask 102'' and a portion of polysilicon layer 106' after the etchback process may then be removed by performing an etching process. In example FIG. 1G reference numeral 106'' denotes polysilicon after the dry etch process. In removing hard mask 102'' using the dry etch process, a portion of gate oxide film 104 within trenches A may also be removed. As illustrated from reference numeral L of example FIG. 1G, a portion of gate oxide film 104 can be etched, and thus, lost.

This is because both hard mask 102'' and gate oxide film 104 have the same oxide film structure.

As described above, phenomena such as the leakage current can occur due to etching of the gate oxide film for isolating source/drain regions and a polysilicon region. Accordingly, device characteristics are degraded, which may result in a problem that a current path changes after subsequent source/drain region is formed.

SUMMARY

Embodiments relate to a method of fabricating a semiconductor device having a vertical structure using a high voltage.

Embodiments relate to a method of fabricating a high-voltage semiconductor device which prevents etching of an isolation oxide film which may normally occur when forming a vertical trench structure device by forming a spacer in a polysilicon region of a trench structure.

Embodiments relate to a method of fabricating a high-voltage semiconductor device which prevents degradation of device characteristics and influence by a polysilicon recess.

Embodiments relate to a method of fabricating a high-voltage semiconductor device which may include at least one of the following steps: forming first photoresist patterns to define nitride film spacer regions by performing a photolithography process on the entire surface of a semiconductor substrate; and then etching a surface of the semiconductor substrate along the first photoresist patterns; and then removing the first photoresist patterns; and then, depositing an etch-stop film on and/or over the semiconductor substrate on which the etch process has been performed; and then performing an etchback process on the etch-stop film; and the forming a hard mask on and/or over the entire surface of the semiconductor substrate having the etchback-processed etch-stop film formed thereon; and then performing a photolithography process on the hard mask to thereby form second photoresist patterns to define gate electrode regions; and then patterning the hard mask by performing a dry etch process employing the second photoresist patterns; and then patterning the etch-stop film up to the surface of the semiconductor substrate to thereby form spacers.

Embodiments relate to a method of fabricating a high-voltage semiconductor device which may include at least one of the following steps: forming a first trench in the semiconductor substrate; and then forming a nitride film on the semiconductor substrate and in the first trench; and then forming a first nitride film pattern in the first trench by performing a first etchback process on the nitride film; and then forming a first oxide film on the semiconductor substrate including the nitride film pattern; and then forming spacers composed of second nitride film patterns on sidewalls of the first trench by patterning the first nitride film pattern to expose the first trench; and then forming a second trench as a deep trench by patterning an exposed portion of the semiconductor substrate corresponding to the first trench; and then forming a second oxide film on sidewalls of the second trench and the spacers; and then forming a polysilicon layer in the second trench and on the second oxide film; and then removing portions of the polysilicon layer and the first oxide film; and then removing the remaining portion of the first oxide film and another portion of the polysilicon layer.

Embodiments relate to a high-voltage semiconductor device which may include at least one of the following: a semiconductor substrate having a deep trench formed therein; a gate oxide film formed on sidewalls of the deep trench; a polysilicon layer formed in the deep trench and on the gate oxide film; and spacers formed on sidewalls of the trench at a portion of the deep trench above the gate oxide film.

DRAWINGS

Example FIGS. 1A to 1G illustrates a method of fabricating a high-voltage semiconductor device.

Example FIGS. 2A to 2K illustrate a method of fabricating a high-voltage semiconductor device, in accordance with embodiments.

DESCRIPTION

Hereinafter, embodiments will be described in detail with reference to the accompanying drawings so that they can be readily implemented by those skilled in the art.

Figure 2A:
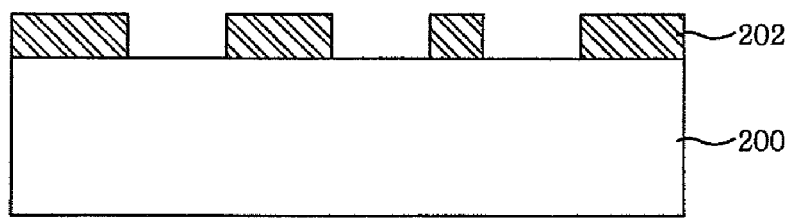

As illustrated in example FIG. 2A, a plurality of first photoresist patterns 202 may be formed on and/or over the entire surface of a silicon substrate as semiconductor substrate 200 by performing a photolithography process. First photoresist patterns 202 refer to photoresist patterns defining nitride film spacer regions in accordance with embodiments. First photoresist patterns 202 may each have a width smaller than a pattern width of a subsequent second photoresist pattern.

Figure 2B:
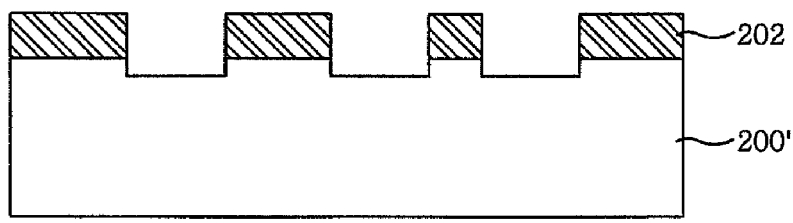

As illustrated in example FIG. 2B, the surface of semiconductor substrate 200 may then be etched along first photoresist patterns 202 to form a plurality of first trenches. In example FIG. 2B, reference numeral 200' denotes the semiconductor substrate after the etch process is performed.

Figure 2C:
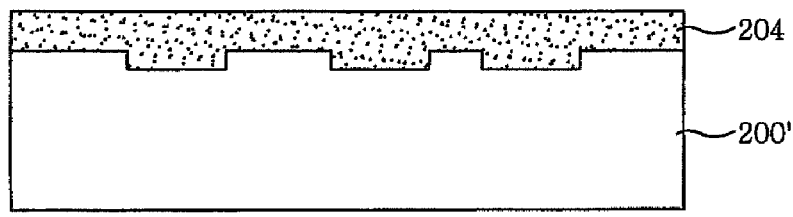

As illustrated in example FIG. 2C, after first photoresist patterns 202 are removed, an etch-stop film, for example, a nitride film 204 may then be deposited on and/or over semiconductor substrate 200' and in the trenches. Nitride film 204 is important as it includes an element for forming subsequent nitride film spacers.

Figure 2D:
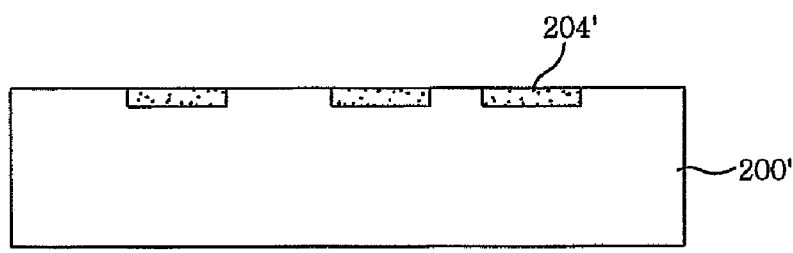

As illustrated in example FIG. 2D, an etchback process may then be performed on nitride film 204 to remove portions of nitride film 204 from the uppermost surface of the semiconductor substrate 200'. Accordingly, the uppermost surface of nitride film 204 is on the same plane as the uppermost surface of semiconductor substrate 200'. In example FIG. 2D, reference numeral 204' denotes the nitride film after the etchback process is carried out.

Figure 2E:
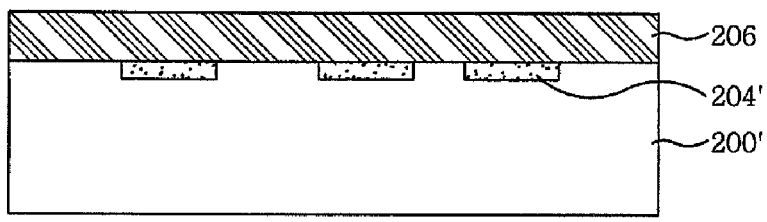

As illustrated in example FIG. 2E, a thermal oxide film hard mask 206, may then be formed on and/or over the entire surface of semiconductor substrate 200' including nitride film 204'.

Figure 2F:
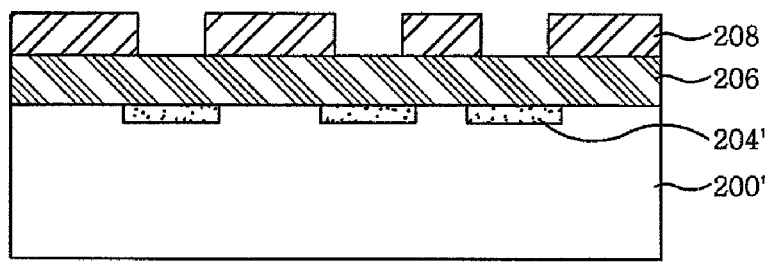

As illustrated in example FIG. 2F, a photolithography process may then be performed on an uppermost surface of hard mask 206, thus forming second photoresist patterns 208 defining gate electrode regions. Second photoresist pattern 208 may have the same pattern width as that of a photoresist pattern to define a general gate electrode region. Preferably, second photoresist pattern 208 may have a width greater than a pattern width of first photoresist pattern 202.

Figure 2G:
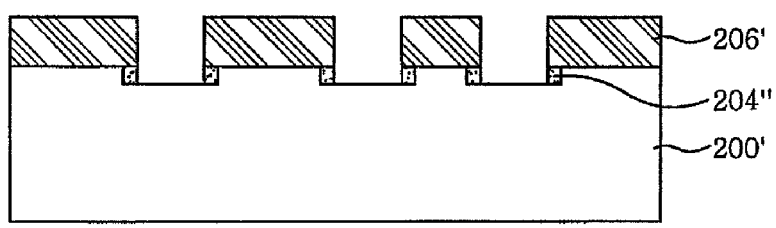

As illustrated in example FIG. 2G, hard mask 206' may then be patterned by performing a dry etch process employing second photoresist patterns 208. The underlying nitride film 204' may be patterned to expose semiconductor substrate 200'. In example FIG. 2G, reference numerals 206' and 204" denote the hard mask and the nitride film, respectively, after the patterning process is performed. In essence, reference numeral 204" may be formed in subsequent polysilicon regions of a trench structure by performing the patterning process on etchback-processed nitride film 204'. Accordingly, nitride film spacers 204" may be formed in accordance with embodiments.

Figure 2H:
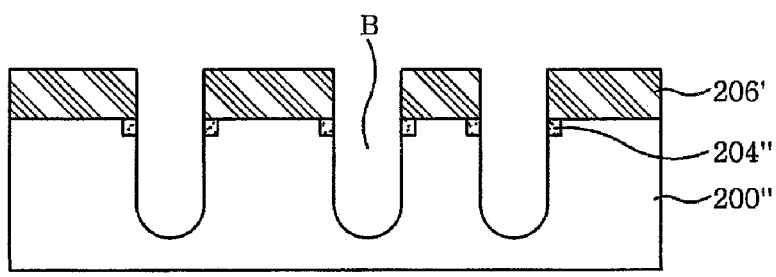

As illustrated in example FIG. 2H, the exposed portions of semiconductor substrate 200' may then be patterned to form second trenches as deep trenches B. Nitride film spacers 204" are provided on sidewalls of deep trenches B. In example FIG. 2H, reference numeral 200" denotes the semiconductor substrate after the patterning process is carried out.

Figure 2I:
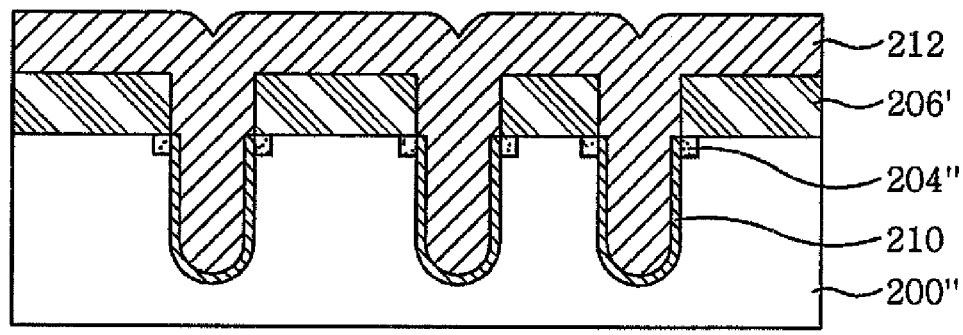

As illustrated in example FIG. 2I, gate oxide film 210 may then be formed on and/or over substrate 200" and sidewalls of trenches B and nitride film spacers 204". Polysilicon layer 212 may then be deposited on and/or over substrate 200" including hard mask 206' and gate oxide film 210 so that trenches B having gate oxide film 210 formed therein are gap-filled with polysilicon layer 212.

Figure 2J:
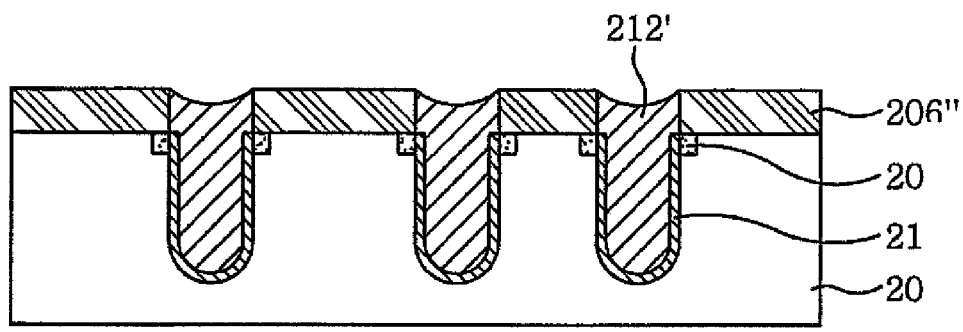

As illustrated in example FIG. 2J, a portion of polysilicon 212 may then be removed by performing an etchback etchback process on polysilicon 212. A portion of hard mask 206' may also be removed during this process. In example FIG. 2J, reference numeral 206" and 212' denote the hard mask and the polysilicon, respectively, after the etchback process is carried out.

Figure 2K:
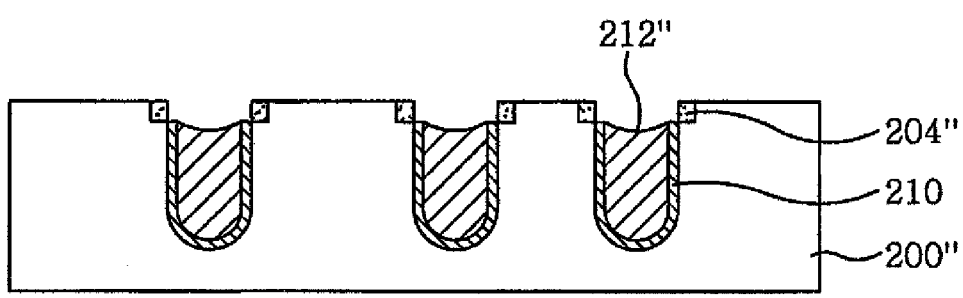

As illustrated in example FIG. 2K, all the remaining hard mask 206" and a portion of polysilicon 212" after the etchback process may then be removed by performing a dry etch process. In FIG. 2K, reference numeral 212" denotes polysilicon after this dry etch process is carried out.

In accordance with embodiments, in removing hard mask 206" using the dry etch process, gate oxide film 210 within trenches B is not removed due to nitride film spacers 204'. Accordingly, leakage current, which may happen since the polysilicon region and subsequent source/drain regions exist on the same plane, can be prevented. As described above, in accordance with embodiments, in fabricating a semiconductor high-voltage device, nitride film spacers may be formed in a polysilicon region to prevent the loss of a gate oxide film. In accordance embodiments, the loss of a gate oxide film, which may typically happen since a top surface of polysilicon having a deep trench structure and source/drain regions exist on the same plane, can be prevented. Therefore, a change of a current path, a phenomenon such as leakage current between a top surface of polysilicon and the source/drain regions, etc. can be prevented. Accordingly, semiconductor device characteristics can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming first photoresist patterns defining nitride film spacer regions by performing a first photolithographic process on a semiconductor substrate; and then
   etching the semiconductor substrate along the first photoresist patterns; and then
   removing the first photoresist patterns; and then
   depositing an etch-stop film over the semiconductor substrate; and then
   performing an etchback process on the etch-stop film; and then forming a hard mask on the semiconductor substrate including the etch-stop film; and then performing a second photolithographic process on the hard mask to form second photoresist patterns defining gate electrode regions; and then patterning the hard mask by performing a dry etch process employing the second photoresist patterns; and then forming spacers by patterning the etch-stop film to expose the surface of the semiconductor substrate.

2. The method of claim 1, wherein a pattern width of each of the second photoresist patterns is the same as a pattern width of the first photoresist pattern.

3. The method of claim 1, wherein the etchback process is performed on the etch-stop film so that the uppermost surface of the etch-stop film is on the same plane as the uppermost surface of the semiconductor substrate.

4. The method of claim 3, wherein the etch-stop film comprises a nitride film.

5. The method of claim 1, wherein forming the spacers comprises forming the spacers in polysilicon regions of a trench structure by performing a patterning process on the etch-stop film.

6. The method of claim 5, wherein the spacers comprise a nitride film.

7. The method of claim 1, further comprising, after forming the spacers:

forming deep trenches by patterning the semiconductor substrate; and then forming a gate oxide film in the deep trenches and on sidewalls of the spacers; and then depositing polysilicon on the gate oxide film to gap-fill the trenches; and then removing a portion of the polysilicon by performing a second etchback process on the polysilicon; and then removing the hard mask and a portion of the polysilicon.

8. A method comprising:

forming a first trench in a semiconductor substrate; and then forming a nitride film on the semiconductor substrate and in the first trench; and then forming a first nitride film pattern in the first trench by performing a first etchback process on the nitride film; and then forming a first oxide film on the semiconductor substrate including the nitride film pattern; and then forming spacers composed of second nitride film patterns on sidewalls of the first trench by patterning the first nitride film pattern to expose the first trench; and then forming a second trench as a deep trench by patterning an exposed portion of the semiconductor substrate corresponding to the first trench; and then forming a second oxide film on sidewalls of the second trench and the spacers; and then forming a polysilicon layer in the second trench and on the second oxide film; and then removing portions of the polysilicon layer and the first oxide film; and then removing the remaining portion of the first oxide film and another portion of the polysilicon layer.

9. The method of claim 8, wherein forming the first nitride film pattern comprises forming the first nitride film pattern such that the uppermost surface of the first nitride film pattern lies on the same plane as the uppermost surface of the semiconductor substrate.

10. The method of claim 8, wherein the spacers are provided on a portion of the sidewalls of the second trenches.

11. The method of claim 10, wherein forming the spacers comprises forming the spacers such that the uppermost surface of the spacers lies on the same plane as the uppermost surface of the semiconductor substrate.

12. The method of claim 8, wherein forming the first trench comprises performing a first etching process exposing a portion of the semiconductor substrate.

13. The method of claim 12, wherein the first etching process comprises a dry etching process.

14. The method of claim 8, wherein forming the first trench comprises:

forming first photoresist patterns on the semiconductor substrate; and then performing a etching process on the semiconductor substrate along the first photoresist patterns.

15. The method of claim 14, wherein the etching process comprises a dry etching process.

16. The method of claim 8, wherein removing the remaining portion of the first oxide film and another portion of the polysilicon layer comprises:

exposing sidewalls of the spacers.

17. The method of claim 8, wherein forming the nitride film comprises forming the nitride film as an etch-stop film.

18. The method of claim 8, wherein forming the first oxide film comprises forming the first oxide film as a hard mask.

19. The method of claim 8, wherein forming the second oxide film comprises forming the second oxide film as a gate oxide film.

20. An apparatus comprising:

a semiconductor substrate having a deep trench formed therein;

a gate oxide film formed on sidewalls of the deep trench;

a polysilicon layer formed in the deep trench and on the gate oxide film; and spacers formed on sidewalls of the trench at a portion of the deep trench above the gate oxide film.

* * * * *